BIASING CIRCUIT FOR USE WITH FIELD-EFFECT TRANSISTORS

Filed Jan. 26, 1967

INVENTOR.
PETER S. MILLER
BY Lockwood D. Burton
ATTORNEY.

United States Patent Office 3,462,701
Patented Aug. 19, 1969

3,462,701

BIASING CIRCUIT FOR USE WITH FIELD-EFFECT TRANSISTORS

Peter S. Miller, Toledo, Ohio, assignor to Honeywell Inc., Minneapolis, Minn., a corporation of Delaware Filed Jan. 26, 1967, Ser. No. 611,914
Int. Cl. H03f 3/04
U.S. Cl. 330—40 5 Claims

ABSTRACT OF THE DISCLOSURE

A biasing circuit for establishing a D.C. bias voltage across the current path of a field-effect semiconductor (FET) is provided by use of the low-impedance characteristic of the base-emitter path of a transistor connected in a common-collector configuration. A fixed bias signal is established at the base of the transistor and this fixed bias is reflected through the aforementioned low-impedance transistor characteristic and is applied across the current path of the FET.

A field-effect transistor (FET) is essentially a semiconductor current control device the conductance of which is controlled by applying an electrical field perpendicular to the current flow. A typical FET has three electrodes, a source electrode, a drain electrode and a gate electrode. A current path is defined between the source and the drain electrodes and the conductivity of that path is controlled by a signal applied between the gate and the source electrodes. Thus, with specific conditions of bias, i.e., a preset D.C. potential applied between the gate and the source electrodes and a preset D.C. potential applied between the drain and the source electrodes, a D.C. drain current of a predetermined magnitude will flow.

The transfer characteristics of an FET are characterized in that as the potential difference between the drain and the source electrodes is increased, the drain current will rise to a saturation level, and thereafter the current will remain substantially constant with further increase in the potential difference. The magnitude of this potential difference between the drain and the source electrodes necessary to cause the drain current of the FET to first saturate is called the "pinch-off" voltage. The magnitude at which the drain current saturates is determined by and is proportional to the potential difference between the gate and the source electrodes. Thus, assuming an FET has linear transfer characteristics and is biased in its region of drain current saturation, there will be a corresponding and proportional change in the conductivity of the FET current path and, thus, the magnitude of the saturated drain current for changes in the potential difference applied between the gate and the source electrodes.

To obtain linear and optimum response, it is essential that an FET be biased to operate in its region of current saturation, i.e., that linear region of operation where the voltage drop between the drain and the source electrodes equals or exceeds "pinch-off" voltage. Heretofore, one typical method used for biasing FET's has been to place the current path of an FET in a series circuit with a fixed resistive load and battery. This method of biasing depends upon the direct current flow in the series circuit. The bias voltage across the FET current path is determined by the product of the current through the current path times the resistance of the current path. This biasing method, however, is restricted since individual FET's, although identically constructed, vary considerably in their conductivity.

Therefore, a biasing circuit as above described has the inherent disadvantage that the bias voltage appearing across the current path of the FET and the current flowing in the series circuit depend upon the conductivity, under the particular circumstances, of the individual FET used. Thus, if the resistance of the FET current path is low, the voltage drop across the current path will be also low. This presents the problem that the bias voltage across the current path may drop below the "pinch-off" voltage and the FET will then no longer operate in its region of saturation. This problem may be corrected by decreasing the load resistance but then the voltage gain obtained will be correspondingly decreased.

It is accordingly, an object of the present invention to provide a biasing circuit for maintaining a constant potential difference across a current path defined by a control element.

It is more specifically, an object of the present invention to provide a biasing circuit as set forth characterized by its utility to bias the current path of a semiconductor, more particularly an FET semiconductor.

Further, it is an object of the present invention to provide biasing apparatus as set forth which provides a constant A.C. load.

In accomplishing these and other objects, there has been provided, in accordance with the present invention, a biasing circuit for establishing a D.C. bias voltage across the current path of a control element, such as an FET semiconductor. The circuit takes advantage of a low impedance characteristic of the base-emitter path of a transistor connected in a common-collector configuration. A fixed bias signal is established at the base of the transistor; this fixed bias is then reflected, through the aforementioned low-impedance characteristic, to be applied across the control element. In this arrangement, the bias across the control element is independent of the load on or current flowing through the control element.

A better understanding of this invention may be had from the following detailed description when read in connection with the accompanying drawing in which.

Figure 1:
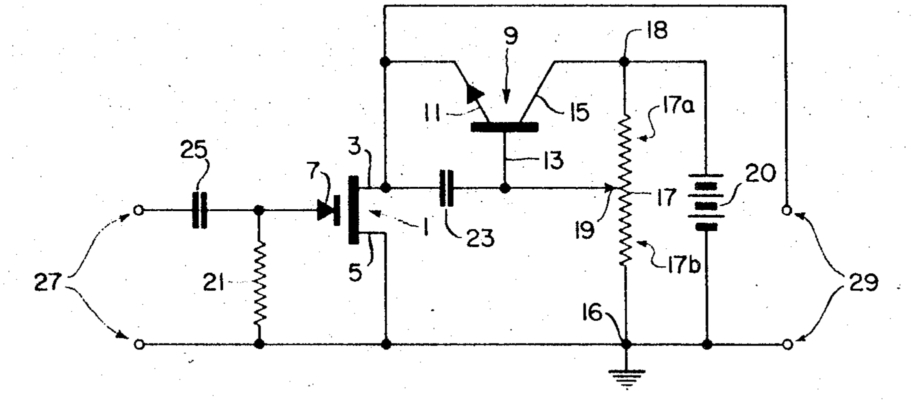
FIGURE 1 is a schematic diagram of a control circuit having a bias control means according to the present invention.

Referring now to the drawings in more detail, there is shown in FIGURE 1 an FET 1 with a drain electrode 3, a source electrode 5 and a gate electrode 7. A battery or power source means 20 supplies D.C. power, i.e., a substantially constant bias voltage, to the circuit and is connected across a potentiometer 17, the positive terminal of the battery 20 being connected to the potentiometer terminal 18 and the negative terminal being commonly connected to the potentiometer terminal 16 and ground. The voltage from the battery 20 is coupled to the FET drain electrode 3 via a transistor 9 and to the FET source electrode 5 via ground. The transistor 9 has an emitter electrode 11, a base electrode 13, and a collector electrode 15. The collector electrode 15 and base electrode 13 are connected to the potentiometer terminal 18 and an adjustable voltage pickoff 19, respectively. The emitter electrode 11 and base electrode 13 are coupled to the FET drain electrode 3, with the emitter electrode 11 being directly connected and the base electrode 13 being coupled through a capacitor 23. The gate electrode 7 receives input signals applied to an input terminal 27 via a series connected capacitor 25 and a parallel connected resistor 21. Output signals are sensed across the output terminals 29, one of the output terminals 29 is connected to the FET drain electrode 3 and the other is connected to ground.

Figure 2:
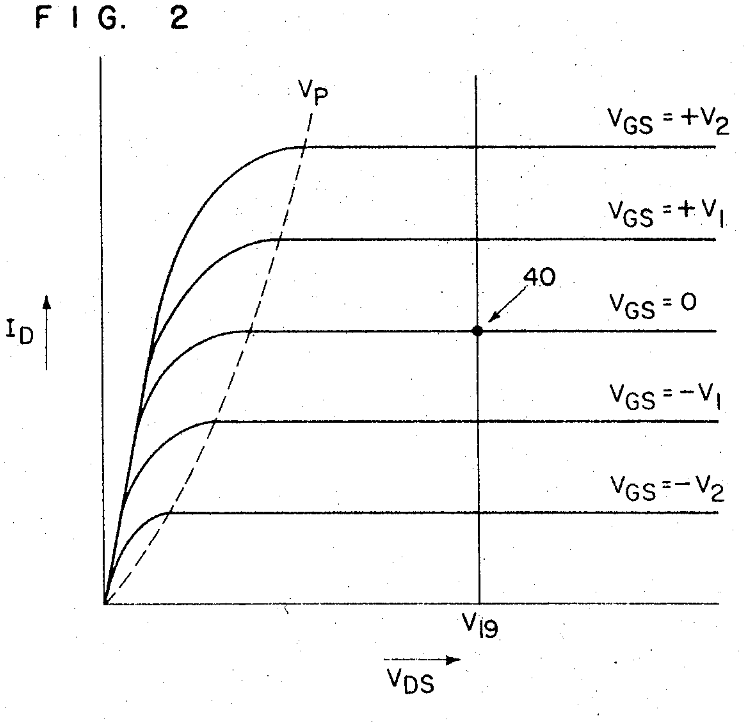
FIGURE 2 is a set of transfer characteristics for an IGMOSFET semiconductor as used in the circuit shown in FIGURE 1.

FIGURE 2 shows a graph of the transfer characteristics for a typical N-type insulated gate metal-oxidesemiconductor FET (IGMOSFET) as was used in a preferred embodiment of the invention. The abscissa of the graph is designated by the symbol $V_{DS}$ which indicates the drain to source voltage across FET 1. The ordinate is designated by the symbol $I_D$ which indicates the magnitude of the drain current. The drain current can be considered to be either the electron flow from the source to the drain or the conventional current flow from positive to negative, i.e., in this case from the drain to the source. The curves drawn upon the graph, and designated by the symbol $V_{GS}$, represent the operating characteristics of the FET 1 at specific and constant gate to source voltages. The $V_{GS}$ voltages increase in magnitude, either positively or negatively, on either side of the line of constant gate to source voltage $V_{GS}=0$. The dotted curve upon the graph is designated by the symbol $V_P$ and indicates the "pinch-off" voltage. The "pinch-off" voltage is that minimum $V_{DS}$ voltage at which the FET 1 drain current, $I_D$, is first saturated.

As before mentioned, to obtain linear and optimum response it is essential that an FET be biased to operate in its region of current saturation, i.e., that linear region of operation where the voltage drop between the drain and the source electrodes equals or exceeds "pinch-off" voltage. The method by which the circuit of the present invention biases an FET in its region of current saturation may be understood by considering the D.C. operation of the circuit shown in FIG. 1.

Referring to FIGURE 1, the voltage pick-off 19 is first adjusted so that the voltage appearing thereat will be greater than the maximum "pinch-off" voltage for that region of the FET characteristic in which the FET 1 is intended to operate. The total resistance of the potentiometer 17 can be considered to be composed of two parts, **17*a* and 17*b*. The resistances 17*a* and 17*b* are defined as those parts of the total resistance of the potentiometer 17 between the voltage pick-off 19 and the terminals 18 and 16, respectively. In the circuit embodying the present invention, the voltage across the resistance 17*a* is imposed upon the collector to base junction of the transistor 9 and reverse biases this NP junction of the NPN transistor illustrated. Since this NP junction is reverse biased, no current will flow across the junction, except that small current due to minority carriers and the current path from the collector electrode 15 to the base electrode 13** will act as an extremely large impedance.

The base electrode 13, which is at the same voltage potential as the voltage pick-off 19, will forward bias the base to emitter junction of the transistor 9. Thus, the impedance of the forward biased NP junction from the base electrode 13 to the emitter electrode 11 will be extremely low and the direct current flow from the base electrode 13 to ground, via the FET 1, will be essentially determined by the resistance of the current path of the FET 1. That is to say that the resistance of the forward biased NP base to emitter junction of the transistor 9 is so small in comparison to the resistance of the current path from the drain electrode 3, to the source electrode 5 that the resistance of the forward biased NP junction can be considered negligible. Moreover, the voltage drop across the base to emitter junction of the transistor 9 will then also be negligible and the drain electrode 3 will be thus clamped at the voltage on the voltage pick-off 19. This voltage is designated $V_{19}$ and is shown as the constant $V_{DS}$ line drawn in FIGURE 2. Further, since there is no D.C. bias introduced between the gate electrode 7 and the source electrode 5, the FET 1 will be biased to operate about the point in FIGURE 2 designated by the numeral 40 at which the D.C. potential between the gate and the source electrodes equal zero and the potential difference between the drain and the source electrodes equals $V_{19}$. While an NP transistor is used in the preferred embodiment of the present invention, a PNP transistor could be used by reversing the polarities of the biasing across the terminals of the transistor 9, as is well known in the art. Further a PNP or NPN transistor semiconductor with proper biasing could be used to bias N or P type FET's.

At A.C. operating frequencies, with A.C. input signals applied at the input terminals 27, the capacitors 23 and the battery 20 will act as short circuits to the A.C. signals. Therefore the FET 1 will appear to have an A.C. load connected between the drain electrode 3 and the source electrode 5 comprising the parallel combination of the resistances **17*a* and 17*b*. This A.C. load results since in A.C. operation the battery shorts the potentiometers terminals 18 to ground and the capacitor 23 A.C. connects the voltage pick-off to drain electrode 3. The reversed biased base to collector NP junction of the transistor 9, A.C. connected in parallel across the resistors 17*a* and 17*b*, has no significant affect on the effective A.C. load impedance since it appears as an extremely high impedance in comparison to the resistance 17*a* and 17*b***.

Thus in operation the A.C. input signals, applied to the input terminals 27 and placed across the gate electrode 7 and the source electrode 5 via the resistor 21, vary the conductivity of the FET 1, thereby causing the drain current to proportionally vary about the operating point 40 and along the voltage line $V_{19}$. These changes in drain current correspondingly vary the A.C. voltage across the A.C. load effectively comprised of the parallel resistors **17*a* and 17*b* and thus cause an A.C. signal to appear upon the output terminals 29**.

While the preferred embodiment of the present invention is employed to bias the current path of an IGMOSFET semiconductor, the scope of the invention is not limited thereto, but may be used to maintain a substantially constant potential difference across current paths of other types of FET semiconductors and of other type of control devices defining current paths.

Thus, there has been provided, in accordance with the present invention, a biasing circuit which will maintain a substantially constant potential difference across a current path defined by a control element and provides an effectively constant A.C. load.

The embodiments of the invention in which an exclusive property or privilege are claimed are defined as follows:

1. In a control circuit having a control element comprising bias responsive active means for controlling the current flowing between a first and second output terminals of said control circuit: the improvement comprising a constant voltage bias control means connected, relative to said output terminals, in shunt with said control element; said bias control means including a semiconductor transistor having a collector, base and emitter electrodes, first and second resistors, said first resistor being coupled between said collector and base electrodes, said second resistor being coupled between said base electrode and said first output terminal said second output terminal being coupled to said emitter electrode, and first and second voltage supply terminals for connection to a bias voltage supply means, voltage supply terminal being connected to said collector electrode and said second voltage supply terminal being connected to said first output terminal whereby the bias potential difference between said first and second output terminals is maintained substantially constant whenever a substantially constant bias voltage is applied to said first and second voltage supply terminals.

2. The apparatus of claim 1 wherein said control element is a semiconductor having a first and second electrode means defining a current path for the current flowing between said first and second output terminals.

3. The apparatus of claim 2 wherein said control element is a semiconductor field-effect transistor having a source and drain electrode means defining said current path for the current flowing between said first and second output terminals and a gate electrode means for controlling the conductivity of said current path.

4. The apparatus of claim 1 wherein a capacitor is coupled between said base and said emitter electrodes of said semiconductor transistor.

5. The apparatus of claim 4 wherein said control element is a semiconductor field-effect transistor having a source and drain electrode means defining a current path for the current flowing between said first and second output terminals and a gate electrode means for controlling the conductivity of said current path.

References Cited

UNITED STATES PATENTS

| | | | |
|---|---|---|---|
| 3,024,422 | 3/1962 | Jansson | 330—18 |
| 3,286,189 | 11/1966 | Mitchell et al. | 330—18 |
| 3,181,079 | 4/1965 | Bregman | 330—18 |

OTHER REFERENCES

Gosling, "Circuit Applications of Field Effect Transistors, Part I—Input Circuits," British Communications and Electronics, July 1964, pp. 476–479.

ROY LAKE, Primary Examiner

J. B. MULLINS, Assistant Examiner

U.S. Cl. X.R.

330—35, 38